United States Patent
Aoki et al.

(10) Patent No.: US 7,732,277 B2
(45) Date of Patent: Jun. 8, 2010

(54) SEMICONDUCTOR DEVICE AND METHOD OF FABRICATING THE SAME

(75) Inventors: Nobutoshi Aoki, Kanagawa (JP); Hiroshi Akahori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 11/902,752

(22) Filed: Sep. 25, 2007

(65) Prior Publication Data
US 2008/0073697 A1 Mar. 27, 2008

(30) Foreign Application Priority Data
Sep. 26, 2006 (JP) ............................. 2006-261238

(51) Int. Cl.
*H01L 21/336* (2006.01)
(52) U.S. Cl. ............................. 438/257; 257/E21.422; 257/E21.626
(58) Field of Classification Search .......... 257/E21.626, 257/E21.422; 438/257, 258
See application file for complete search history.

(56) References Cited

U.S. PATENT DOCUMENTS

| 7,060,559 | B2 | 6/2006 | Ozawa et al. | |
| 7,259,421 | B2 * | 8/2007 | Hur et al. | 257/315 |
| 2002/0117706 | A1 * | 8/2002 | Shimizu | 257/298 |
| 2004/0099900 | A1 * | 5/2004 | Iguchi et al. | 257/315 |
| 2004/0159886 | A1 * | 8/2004 | Lee et al. | 257/331 |
| 2005/0245029 | A1 * | 11/2005 | Choi et al. | 438/257 |

FOREIGN PATENT DOCUMENTS

| JP | 2001-144170 | 5/2001 |
| JP | 2004-186185 | 7/2004 |

* cited by examiner

Primary Examiner—Jerome Jackson, Jr.
Assistant Examiner—Paul A Budd
(74) Attorney, Agent, or Firm—Finnegan, Henderson, Farabow, Garrett & Dunner, L.L.P.

(57) ABSTRACT

A semiconductor device according to an embodiment of the present invention includes: a semiconductor substrate; an isolation structure formed in a trench, formed in the semiconductor substrate, through a semiconductor oxide film; a floating gate formed on the semiconductor substrate between the isolation structures through an insulating film; a gate oxidation protection film formed on a side surface, on the isolation structure side, of the floating gate so that each of a part of a side surface and a bottom surface of the gate oxidation protection film contacts the insulating film; and a control gate formed on the floating gate through an inter-gate insulating film.

15 Claims, 6 Drawing Sheets

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2006-261238, filed on Sep. 26, 2006, the entire contents of which are incorporated herein by reference.

BACKGROUND OF THE INVENTION

The present invention relates to a semiconductor device having a floating gate formed therein, and a method of fabricating the same.

According to a conventional method of fabricating a semiconductor device having a floating gate formed therein, after a buried trench through which an isolation structure is intended to be buried in a silicon substrate is formed, oxidation is performed for the purpose of restoring an inner wall of the buried trench having an etching damage received thereby. However, there is encountered a problem that even polycrystalline silicon of which a floating gate is made is oxidized, so that a bird's beak occurs in the floating gate.

The occurrence of the bird's beak in the floating gate may cause such problems that shapes of peripheral portions of the floating gate vary, that a short channel effect becomes easy to occur, and that the reliability of the semiconductor device is reduced. In addition, an influence of the bird's beak is further actualized along with the progress of scale down of the circuits.

A technique for preventing crystal grains of silicon from spreading to an isolation structure side due to a heat treatment after completion of processing for a floating gate electrode (floating gate) by forming a nitride film on a sidewall of the floating gate electrode made of polycrystalline silicon or amorphous silicon, especially, on a sidewall of the floating gate electrode along a channel length direction is reported as conventional one. This technique, for example, is described in Japanese Patent KOKAI No. 2004-186185. However, this technique is not developed for the purpose of suppressing the bird's beak, and thus cannot suppress the occurrence of the bird's beak in the floating gate.

BRIEF SAY OF THE INVENTION

A semiconductor device according to one embodiment of the present invention includes:
a semiconductor substrate;
an isolation structure formed in a trench, formed in the semiconductor substrate, through a semiconductor oxide film;
a floating gate formed on the semiconductor substrate between the isolation structures through an insulating film;
a gate oxidation protection film formed on a side surface, on the isolation structure side, of the floating gate so that each of a part of a side surface and a bottom surface of the gate oxidation protection film contacts the insulating film; and
a control gate formed on the floating gate through an inter-gate insulating film.

A method of fabricating a semiconductor device according to another embodiment of the present invention includes:
forming an insulating film on a semiconductor substrate;
forming a semiconductor on the insulating film;
patterning the semiconductor, thereby forming a first trench to a depth at which the insulating film is exposed;
forming an oxidation protection film within the first trench so as to cover a side surface of the semiconductor exposed due to the formation of the first trench;
removing the insulating film located in a bottom portion of the first trench having the oxidation protection film formed therein, and a portion of the semiconductor substrate located right under the first trench, thereby forming a second trench having a predetermined depth;
forming an oxide film in an inner wall of the second trench formed in the semiconductor substrate by performing oxidation processing; and
filling an insulating material in the second trench having the oxide film formed therein, thereby forming an isolation structure.

DETAILED DESCRIPTION OF THE INVENTION

Figure 1A:
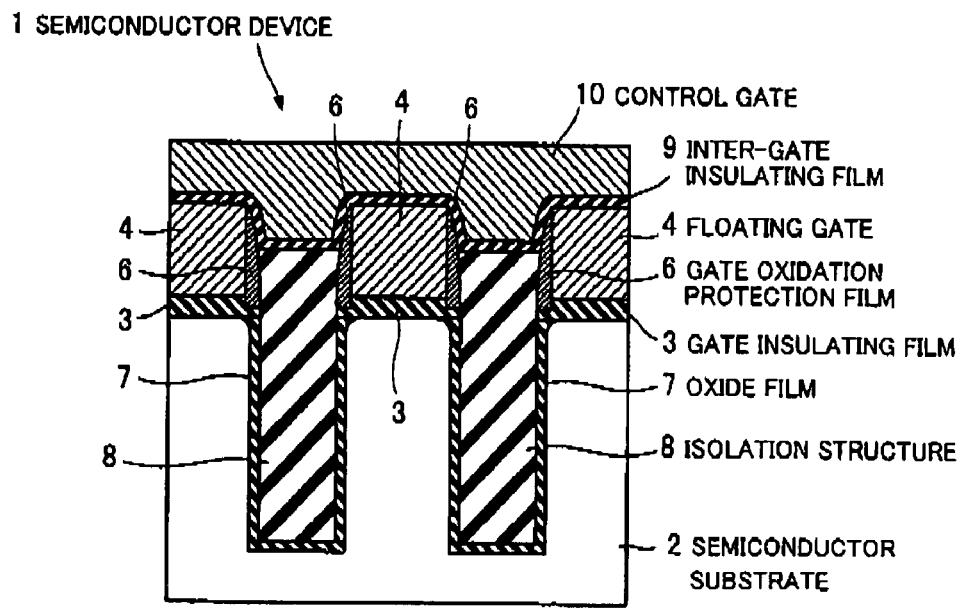
FIG. 1A is a cross sectional view of a semiconductor device according to a first embodiment of the present invention.
Figure 1B:
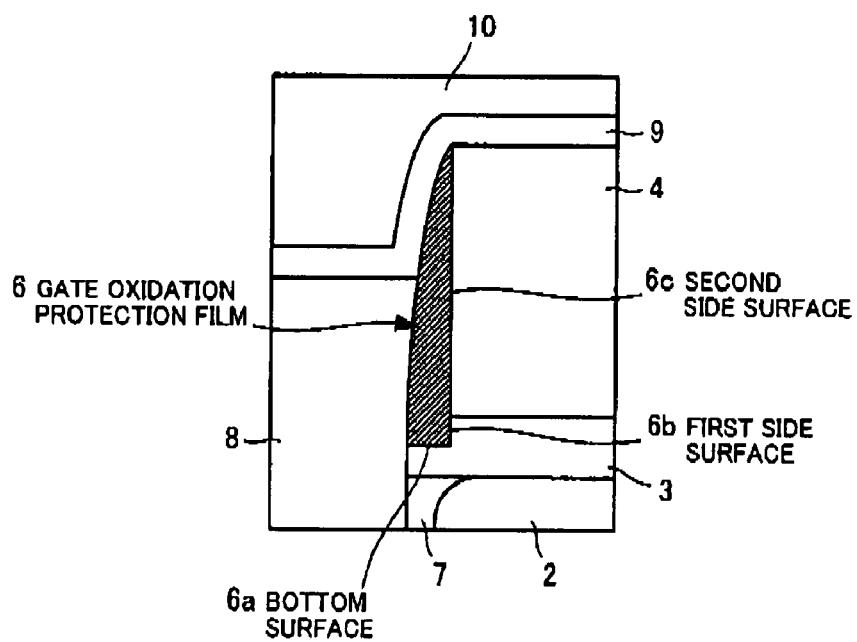
FIG. 1B is a partially enlarged view of the semiconductor device shown in FIG. 1A.

FIG. 1A is a cross sectional view of a semiconductor device according to a first embodiment of the present invention, and FIG. 1B is a partially enlarged view of the semiconductor device shown in FIG. 1A. Here, a semiconductor device 1 is one, such as a flash memory, having a floating gate formed therein. Thus, FIGS. 1A and 1B show cross sections, of the semiconductor device 1, taken in a direction parallel with a gate width direction.

As shown in FIG. 1A, the semiconductor device 1 generally includes a semiconductor substrate 2, an isolation structure 8 formed in the semiconductor substrate 2, an oxide film 7 formed between the semiconductor substrate 2 and the isolation structure 8, a floating gate 4 formed on the semiconductor substrate 2 through a gate insulating film 3, a gate oxidation protection film 6 formed on a side surface (that is, a sidewall along a channel length direction), on the isolation structure side, of the floating gate 4, and a control gate 10 formed on the floating gate 4 through an inter-gate insulating film 9.

FIG. 1B is an enlarged view of the gate oxidation protection film 6 and its periphery in the semiconductor device 1 shown in FIG. 1A. As shown in FIG. 1B, each of a bottom surface 6a and a first side surface 6b of the gate oxidation protection film 6 contacts the gate insulating film 3, and a second side surface 6c thereof contacts the floating gate 4.

The semiconductor substrate 2, for example, is made of single crystal silicon or the like.

The isolation structure 8 is a shallow trench isolation (STI) structure made of an insulating material such as a silicon oxide.

The oxide film 7 is a silicon oxide film which is formed by oxidizing a surface of the semiconductor substrate 2.

The gate insulating film 3, and the inter-gate insulating film 9 are made of insulating materials such as a silicon oxide and a silicon nitride, respectively.

Each of the floating gate 4 and the control gate 10 is made of polycrystalline silicon or the like.

The gate oxidation protection film 6 is made of an insulating material such as a silicon oxide, a silicon nitride or a silicon oxynitride. Alternatively, the gate oxidation protection film 6 may be formed from a lamination film formed by laminating these different materials. When the gate oxidation protection film 6 is made of the silicon oxide, the silicon oxide is formed by utilizing a vapor deposition method such as a chemical vapor deposition (CVD) method or a physical vapor deposition (PVD) method, a radical oxidation method, a thermal oxidation method or the like. In addition, when the gate oxidation protection film 6 is made of the silicon nitride, the silicon nitride is formed by utilizing the vapor deposition method, the radical nitridation method, a method of performing thermal nitridation in an $NH_3$ ambient atmosphere, or the like. Also, when the gate oxidation protection film 6 is made of the silicon oxynitride, the silicon oxynitride is formed by utilizing a method of performing thermal oxynitridation in an NO or $N_2O$ ambient atmosphere, nitridation of a silicon oxide, or the like.

FIGS. 2A to 2I are respectively cross sectional views showing processes for fabricating the periphery of the floating gate in the semiconductor device according to the first embodiment of the present invention.

Figure 2A:
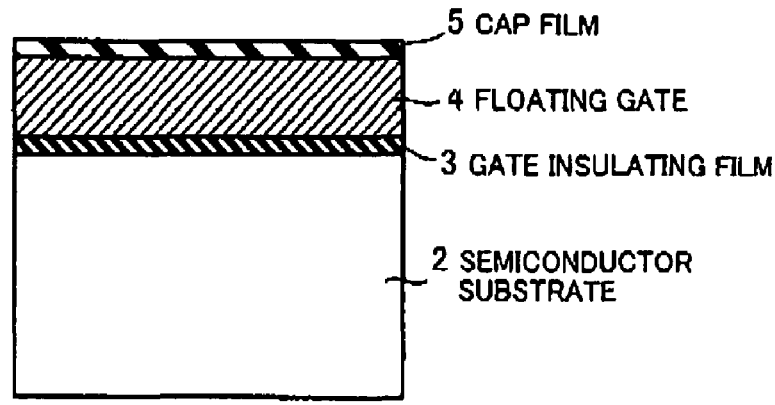
FIGS. 2A to 2I are respectively cross sectional views showing processes for fabricating the semiconductor device according to the first embodiment of the present invention.

Firstly, as shown in FIG. 2A, the gate insulating film 3 made of a silicon oxide or the like, the floating gate 4 made of polycrystalline silicon or the like, and a cap film 5 made of a silicon nitride or the like are laminated in order on the semiconductor substrate 2 by utilizing the CVD method or the like. Note that, the cap film 5 is not necessarily formed on the floating gate 4 in this embodiment.

Figure 2B:
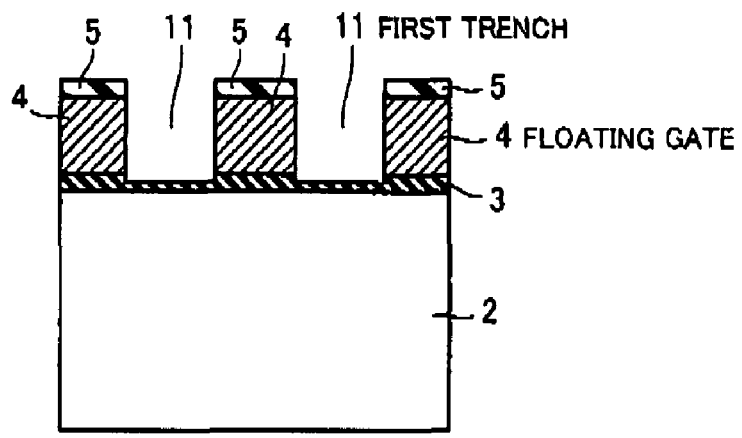

Next, as shown in FIG. 2B, each of the cap film 5 and the floating gate 4 is patterned by utilizing a patterning technique such as a lithography method or a sidewall transfer, thereby forming a first trench 11. At this time, the etching is not performed to a position where the gate insulating film 3 is perfectly removed away from a viewpoint of sufficiently restoring the semiconductor substrate, having etching damage received thereby during the etching of the semiconductor substrate 2, by carrying out the oxidation processing.

Note that, the gate insulating film 3 may be etched to the extent that the surface of the semiconductor substrate 2 is slightly exposed in the vicinity of a center of a bottom surface of the first trench 11. However, the etching is preferably performed to the middle of a film thickness of the gate insulating film 3 so that a bottom surface portion of the gate insulating film 3 contacting a sidewall of the first trench 11 is reliably left at least in a bottom surface portion of the first trench 11 without being perfectly removed.

On the other hand, the etching may be performed to a position where a surface of the gate insulating film 3 is just exposed. In this case, however, there is the possibility that the effect of suppressing the occurrence of the bird's beak in the floating gate 4 is reduced as compared with the above case where the etching is performed to the middle of the gate insulating film 3.

In addition, the etching is performed under a condition that an etching rate of the floating gate 4 is made higher than that of the gate insulating film 3 by adjusting a partial pressure or the like of an etching gas. In particular, a ratio in etching rate between the floating gate 4 and the gate insulating film 3 is preferably made large as much as possible. A halogen system etching gas can be used in this process. More specifically, an etching gas obtained by mixing HBr with $O_2$, an etching gas obtained by mixing $SF_6$ with $O_2$, an etching gas obtained by adding $N_2$ or Ar to these gases, or the like can be used in this etching process.

Figure 2C:
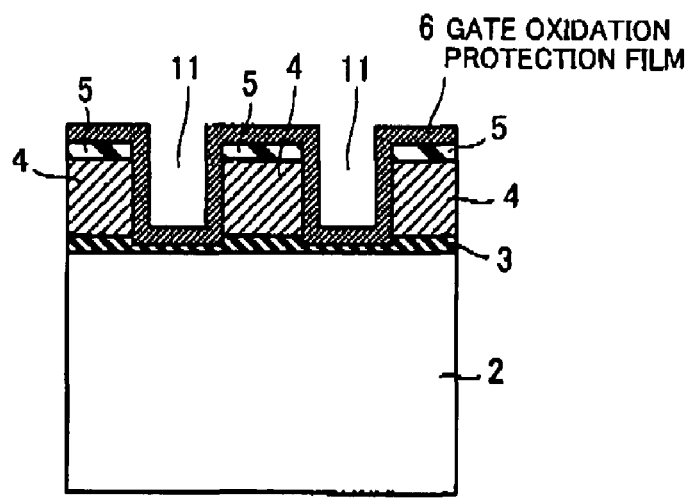
Figure 2D:
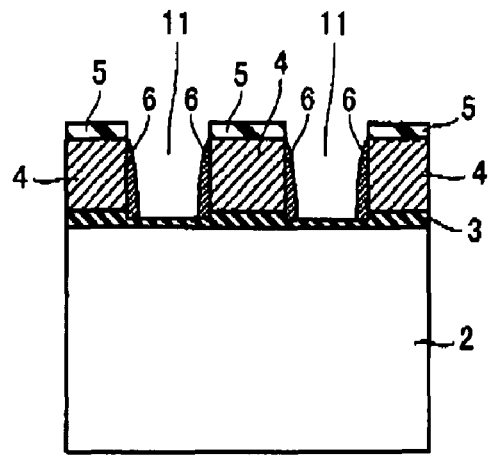

Next, as shown in FIG. 2C, the gate oxidation protection film 6 is formed so as to cover the exposed surfaces of the gate insulating film 3, the floating gate 4, and the cap film 5. Next, as shown in FIG. 2D, the gate oxidation protection film 6 is anisotropically etched to be processed into a sidewall shape which covers side surfaces of the floating gate 4. More specifically, for example, a silicon nitride film is formed to have a thickness of 5 nm by utilizing a low-pressure CVD (LPCVD) method, and is then patterned by utilizing a reactive ion etching (RIE) method, thereby forming the gate oxidation protection film 6.

Figure 2E:
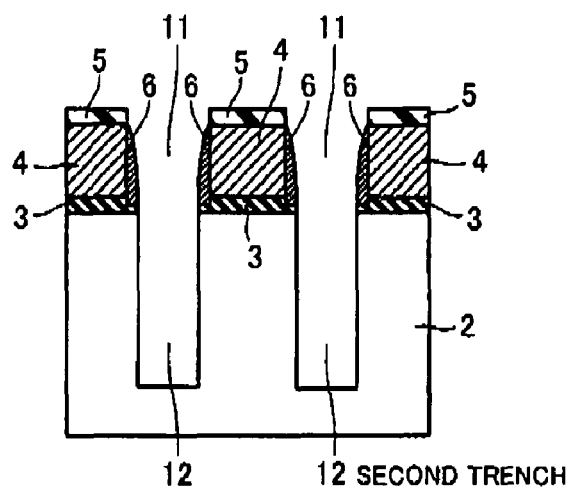

Next, as shown in FIG. 2E, a portion of the gate insulating film 3 which is located in the bottom surface portion of the first trench 11, and a portion of the semiconductor substrate 2 which is located right under the first trench 11 are etched using both the cap film 5 and the gate oxidation protection film 6 as a mask by utilizing the RIE method or the like, thereby forming a second trench 12 for formation of the isolation structure 8. In this etching process, a fluorocarbon system etching gas can be used for the etching for the gate insulating film 3. More specifically, an etching gas obtained by mixing $CHF_3$ with $O_2$, an etching gas obtained by adding Ar to this gas, or the like can be used as the fluorocarbon system etching gas. In addition, an etching gas which is used for the etching for the floating gate 4 in the process shown in FIG. 2B can be used for the etching for the semiconductor substrate 2.

Figure 2F:
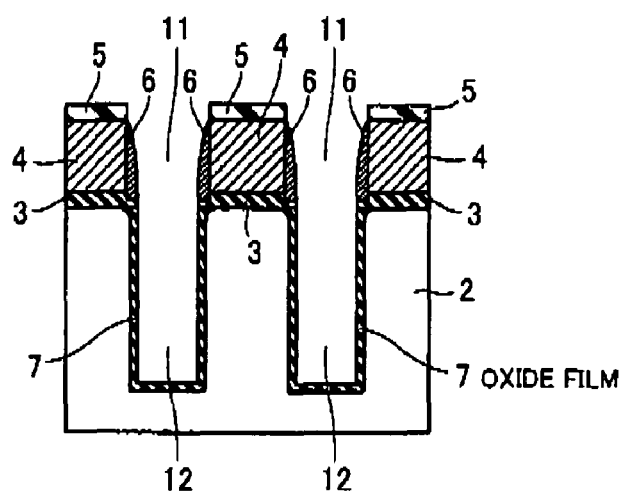

Next, as shown in FIG. 2F, in order to restore an inner wall of the second trench 12 having an etching damage received thereby, an oxidation process is carried out, thereby forming an oxide film 7 in the inner wall of the second trench 12. At this time, the floating gate 4 is not oxidized because a side surface thereof is covered with the gate oxidation protection film 6. As a result, it is possible to prevent the bird's beak from occurring in the floating gate 4.

Note that, in the process shown in FIG. 2B, when the etching is performed to the extent that the gate insulating film 3 is perfectly removed to abrade the surface of the semiconductor substrate 2, the gate oxidation protection film 6 is formed to a position where the gate oxidation protection film 6 contacts the semiconductor substrate 2. For this reason, the portion covered with the gate oxidation protection film 6 is not oxidized. As a result, that portion having the etching damage received thereby cannot be sufficiently restored. In addition, any of the corner portions is not rounded off and thus the fixed electric charges occur therein because the portion covered with the gate oxidation protection film 6 is not oxidized, which may exert a bad influence on the electrical characteristics.

Figure 2G:
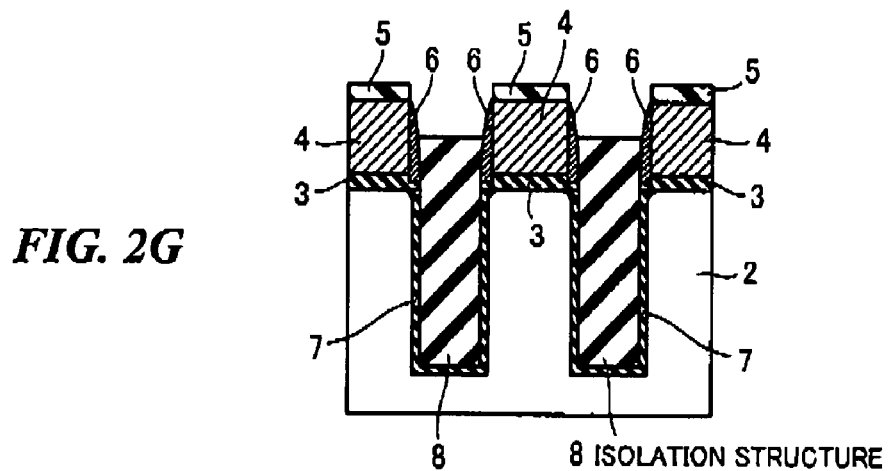

Next, as shown in FIG. 2G, an insulating material is filled in the first trench 11 and the second trench 12 formed continuously therewith, thereby forming the isolation structure 8. A height of the isolation structure 8 can be adjusted by utilizing a suitable etching method such as the RIE method. In this case, an upper surface of the isolation structure 8 is preferably located between an upper surface and a lower surface of the floating gate 4.

Figure 2H:
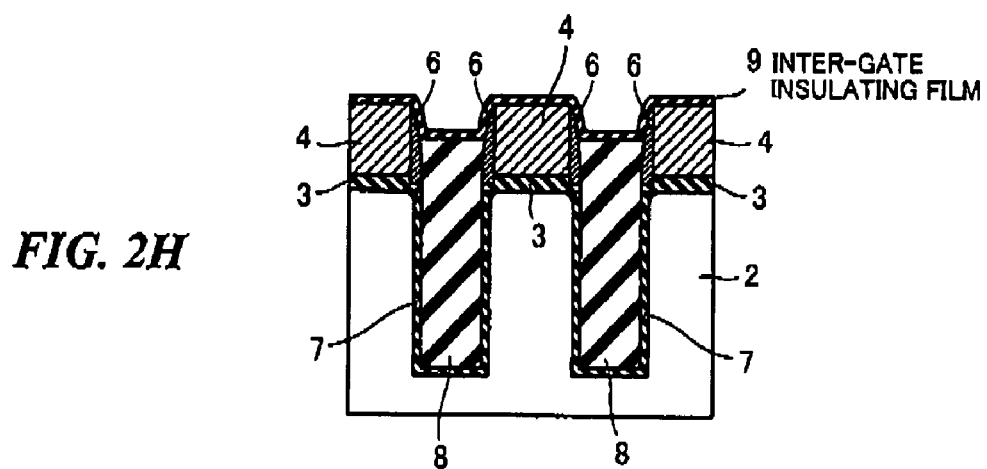

Next, as shown in FIG. 2H, after the cap film 5 is removed, an insulating film is deposited on the semiconductor substrate 2 by utilizing the CVD method or the like, thereby forming the inter-gate insulating film 9. In this case, the gate oxidation protection film 6 covering a side surface portion, of the floating gate 4, which protrudes from the upper surface of the isolation structure B may be removed concurrently with the removal of the cap film 5 under the controlled etching condition for the removal of the cap film 5.

Figure 2I:
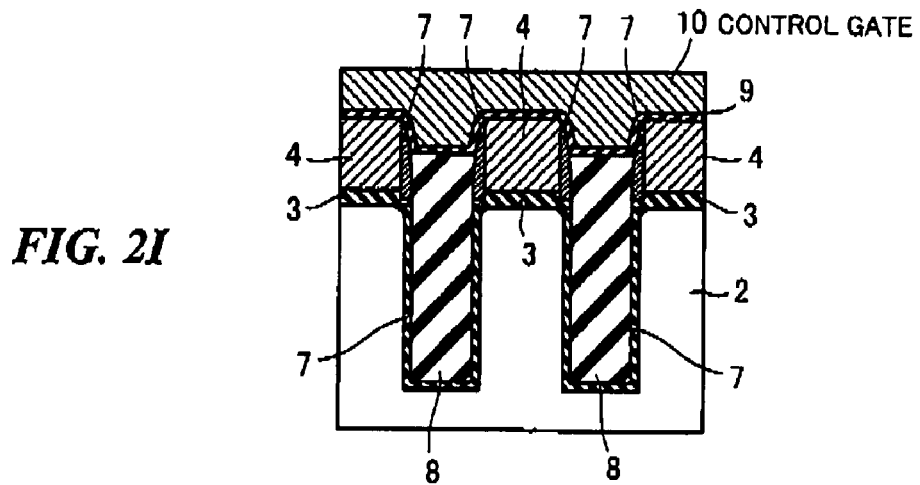

Next, as shown in FIG. 2I, the control gate 10 is formed on the inter-gate insulating film 9 by utilizing the CVD method or the like.

After that, while not illustrated in the figures, the control gate 10, the inter-gate insulating film 9 and the floating gate 4 are processed into a word line shape by, for example, utilizing a lithography method and the RIE method. Thus, a stack gate structure is formed, and impurity ions are implanted into a portion between the adjacent stack gate structures to form a source/drain region, thereby obtaining a memory cell.

According to the first embodiment of the present invention, the oxidation process is carried out after the side surface of the floating gate 4 is covered with the gate oxidation protection film 6, which results in that the floating gate 4 can be prevented from being oxidized, thereby preventing the bird's beak from occurring in the floating gate 4.

A second embodiment of the present invention is different from the first embodiment of the present invention in a process for forming the gate oxidation protection film 6 in a method of fabricating a semiconductor device. Note that, descriptions of the same respects, such as the constitutions of other portions or the like, as those in the first embodiment are omitted here for the sake of simplicity.

FIGS. 3A to 3F are respectively cross sectional views showing processes for fabricating the periphery of a floating gate of a semiconductor device according to the second embodiment of the present invention.

Figure 3A:
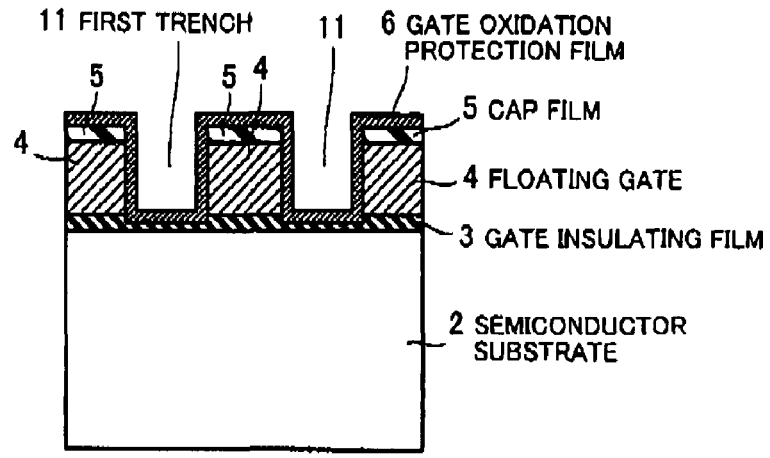
FIGS. 3A to 3F are respectively cross sectional views showing processes for fabricating a semiconductor device according to a second embodiment of the present invention.

Firstly, as shown in FIG. 3A, after the same processes as those shown in FIGS. 2A to 2C in the first embodiment are carried out, the gate insulating film 3, the floating gate 4, the cap film 5, and the gate oxidation protection film 6 are formed in order on the semiconductor substrate 2.

Figure 3B:
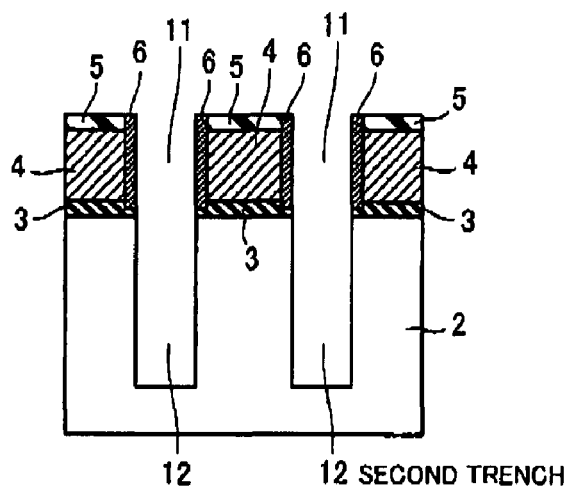

Next, as shown in FIG. 3B, portions of the gate oxidation protection film 6 and the gate insulating film 3 which are located in the bottom portion of the first trench 11, and a portion of the semiconductor substrate 2 which is located right under the first trench 11 are etched by utilizing the RIE method or the like, thereby forming the second trench 12 for formation of the isolation substrate 8. At this time, the gate oxidation protection film 6 is processed into a sidewall shape which covers the side surface of the floating gate 4.

Figure 3C:
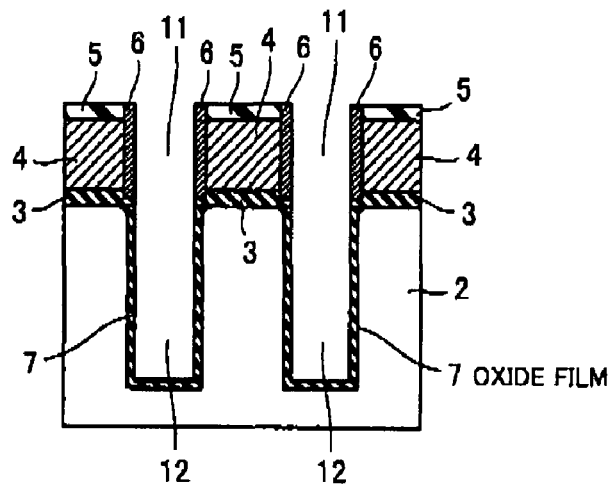

Next, as shown in FIG. 3C, the oxidation process is carried out for the purpose of restoring the inner wall of the second trench 12 having the etching damage received thereby to form the oxide film 7 in the inner wall of the second trench 12. At this time, the floating gate 4 is not oxidized because a side surface thereof is covered with the gate oxidation protection film 6. As a result, the bird's beak can be prevented from occurring in the floating gate 4.

Figure 3D:
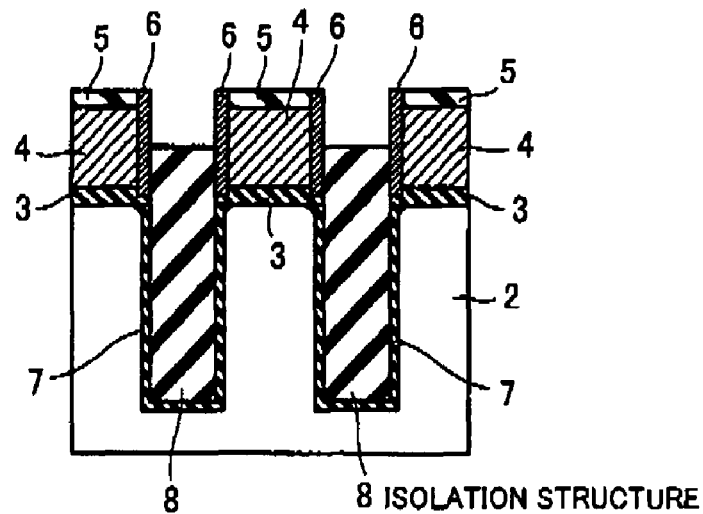

Next, as shown in FIG. 3D, the insulating material is filled in the first trench 11 and the second trench 12 formed continuously with the first trench 11, thereby forming the isolation structure 8. The height of the isolation structure 8 can be adjusted by utilizing the suitable etching method such as the RIE method. In this case, the upper surface of the isolation structure 8 is preferably located between the upper surface and the lower surface of the floating gate 4.

Figure 3E:
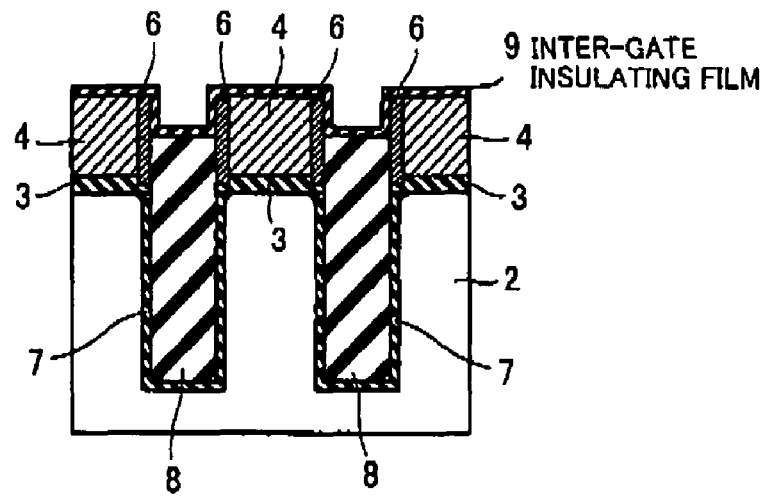

Next, as shown in FIG. 3E, after the cap film 5 is removed, the insulating film is deposited on the semiconductor substrate 2 by utilizing the CVD method or the like, thereby forming the inter-gate insulating film 9. In this case as well, the gate oxidation protection film 6 covering the side surface portion of the floating gate 4, which protrudes from the upper surface of the isolation structure 8 may be removed concurrently with the removal of the cap film 5 under the controlled etching condition for the removal of the cap film 5, thereby increasing a capacity between the stack gates.

Figure 3F:
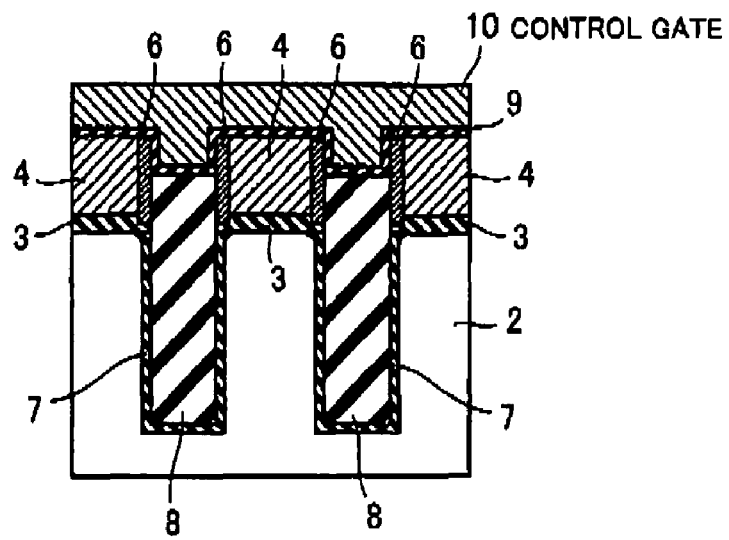

Next, as shown in FIG. 3F, the control gate 10 is formed on the inter-gate insulating film 9 by utilizing the CVD method or the like.

After that, while not illustrated in the figures, the control gate 10, the inter-gate insulating film 9 and the floating gate 4 are processed into the word line shape by, for example, utilizing the lithography method and the like. Thus, the stack gate structure is formed, and the impurity ions are implanted into the portion between the adjacent stack gate structures to form the source/drain region, thereby obtaining the memory cell.

According to the second embodiment of the present invention, the process for processing the gate oxidation protection film 6 into the predetermined shape is not specially provided, but is carried out together with the process for forming the second trench 12, thereby making it possible to reduce the number of processes as compared with that in the first embodiment.

It should be noted that the present invention is not intended to be limited to the above-mentioned embodiments, and the various changes can be implemented by those skilled in the art without departing from the gist of the invention. In addition, the constituent elements of the above-mentioned embodiments can be arbitrarily combined with one another without departing from the gist of the invention.

What is claimed is:

1. A method of fabricating a semiconductor device, comprising:
   forming an insulating film on a semiconductor substrate;
   forming a semiconductor on the insulating film;
   patterning the semiconductor, thereby forming a first trench to a depth at which the insulating film is exposed;
   forming an oxidation protection film within the first trench so as to cover a side surface of the semiconductor exposed due to the formation of the first trench;
   removing the insulating film located in a bottom portion of the first trench having the oxidation protection film formed therein, and a portion of the semiconductor substrate located right under the first trench, thereby forming a second trench having a predetermined depth;
   forming an oxide film in an inner wall of the second trench formed in the semiconductor substrate by performing oxidation processing; and
   filling an insulating material in the second trench having the oxide film formed therein, thereby forming an isolation structure.

2. The method of fabricating a semiconductor device according to claim 1, wherein the oxidation protection film includes a silicon nitride, and is formed by utilizing a vapor deposition method, a radical nitridation method, or a method of performing thermal nitridation in an $NH_3$ ambient atmosphere.

3. The method of fabricating a semiconductor device according to claim 1, wherein the oxidation protection film includes a silicon oxynitride, and is formed by utilizing a method of performing thermal oxynitridation in an NO or $N_2O$ ambient atmosphere, or a method of nitriding a silicon oxide.

4. The method of fabricating a semiconductor device according to claim 1, wherein the oxidation protection film includes a silicon oxide, and is formed by utilizing a vapor deposition method, a radical oxidation method, or a thermal oxidation method.

5. The method of fabricating a semiconductor device according to claim 1, wherein the oxidation protection film is formed on a side surface of the semiconductor exposed due to the formation of the first trench, and on the insulating film exposed due to the formation of the first trench, and the second trench is formed by removing portions of the oxidation protection film and the insulating film which are located in the bottom portion of the first trench, and the portion of the semiconductor substrate which is located right under the first trench.

6. The method of fabricating a semiconductor device according to claim 1, wherein the first trench is formed to a depth corresponding to a middle of a film thickness of the insulating film.

7. The method of fabricating a semiconductor device according to claim 1, wherein the first trench is formed by performing etching under a condition that an etching rate of the semiconductor is higher than that of the insulating film.

8. The method of fabricating a semiconductor device according to claim 7, wherein the first trench is formed by performing the etching using a halogen system gas.

9. The method of fabricating a semiconductor device according to claim 8, wherein the halogen system gas includes at least one of a mixed gas of HBr and $O_2$, a mixed gas of HBr, $O_2$ and $N_2$, a mixed gas of HBr, $O_2$ and Ar, a mixed gas of $SF_6$ and $O_2$, a mixed gas of $SF_6$, $O_2$ and $N_2$, and a mixed gas of $SF_6$, $O_2$ and Ar.

10. The method of fabricating a semiconductor device according to claim 1, wherein the insulating film located in the bottom portion of the first trench is removed by performing etching using a fluorocarbon system gas.

11. The method of fabricating a semiconductor device according to claim 10, wherein the fluorocarbon system gas includes a mixed gas of $CHF_3$ and $O_2$, or a mixed gas of $CHF_3$, $O_2$ and Ar.

12. The method of fabricating a semiconductor device according to claim 1, wherein the portion of the semiconductor substrate located right under the first trench is removed by performing etching using a halogen system gas.

13. The method of fabricating a semiconductor device according to claim 12, wherein the halogen system gas includes at least one of a mixed gas of HBr and $O_2$, a mixed gas of HBr, $O_2$ and $N_2$, a mixed gas of HBr, $O_2$ and Ar, a mixed gas of $SF_6$ and $O_2$, a mixed gas of $SF_6$, $O_2$ and $N_2$, and a mixed gas of $SF_6$, $O_2$ and Ar.

14. The method of fabricating a semiconductor device according to claim 1, further comprising:
    forming a cap film on the semiconductor after the semiconductor is formed, the first trench being formed by patterning each of the semiconductor and the cap film; and
    removing the cap film after the isolation structure is formed.

15. The method of fabricating a semiconductor device according to claim 1, further comprising:
    forming another insulating film on the semiconductor after the isolation structure is formed; and
    forming another semiconductor on the another insulating film.

* * * * *